United States Patent
Lee et al.

(10) Patent No.: US 10,340,890 B2
(45) Date of Patent: Jul. 2, 2019

(54) HIGH ORDER FILTER CIRCUIT

(71) Applicants: Nuvoton Technology Corp., Hsinchu (TW); NCKU Research & Development Foundation, Tainan (TW)

(72) Inventors: Shuenn-Yuh Lee, Tainan (TW); Sz-An Chen, Taichung (TW)

(73) Assignees: NUVOTON TECHNOLOGY CORP., Hsinchu (TW); NCKU RESEARCH & DEVELOPMENT FOUNDATION, Tainan (TW)

( * ) Notice: Subject to any disclaimer, the term of this patent is extended or adjusted under 35 U.S.C. 154(b) by 0 days.

(21) Appl. No.: 16/121,628

(22) Filed: Sep. 5, 2018

(65) Prior Publication Data

US 2019/0020329 A1    Jan. 17, 2019

Related U.S. Application Data

(62) Division of application No. 15/627,829, filed on Jun. 20, 2017, now Pat. No. 10,097,163.

(30) Foreign Application Priority Data

Sep. 26, 2016 (TW) .............................. 105131110 A

(51) Int. Cl.
*H03H 11/04* (2006.01)
*H03H 17/02* (2006.01)

(52) U.S. Cl.
CPC ...... *H03H 11/0422* (2013.01); *H03H 17/025* (2013.01)

(58) Field of Classification Search
CPC ........... H03H 11/0422; H03H 11/0427; H03H 11/0433; H03H 11/0438; H03H 11/0444; H03H 11/045; H03H 11/0455; H03H 11/0461; H03H 11/0466; H03H 11/0472; H03H 17/025; H03H 11/1291; H03M 1/002; H03M 1/1038; H03M 1/14; H03M 1/44

See application file for complete search history.

(56) References Cited

U.S. PATENT DOCUMENTS

| | | | | |
|---|---|---|---|---|
| 5,625,317 A | * | 4/1997 | Deveirman | H03F 3/45475 327/552 |
| 9,698,804 B1 | * | 7/2017 | Funato | H03M 1/1023 |
| 9,866,227 B1 | * | 1/2018 | Bresciani | H03M 3/464 |
| 2013/0194038 A1 | * | 8/2013 | Lozhkin | H03F 1/32 330/149 |
| 2014/0036974 A1 | * | 2/2014 | Min | H04L 25/03019 375/222 |

* cited by examiner

*Primary Examiner* — Patrick C Chen
(74) *Attorney, Agent, or Firm* — Chun-Ming Shih

(57) ABSTRACT

A high order filter circuit is integrated by a plurality of the low order filter circuits. Before correcting the high order filter circuit, switch units may restore the high order filter circuit to the low order filter circuits for correction, and then combine the corrected low order filter circuits to form the original high order filter circuit.

7 Claims, 8 Drawing Sheets

HIGH ORDER FILTER CIRCUIT

CROSS-REFERENCE TO RELATED APPLICATIONS

This application is a divisional application of U.S. application Ser. No. 15/627,829 filed on Jun. 20, 2017, the disclosure of which is incorporated herein by reference.

BACKGROUND OF THE INVENTION

Field of the Invention

The invention relates to signal processing technologies, and more particularly, to a low order filter circuit having a frequency correction function, a frequency correction method for the low order filter circuit, and a high order filter circuit.

Descriptions of the Related Art

Telemedicine is getting more widely applied in non-clinical fields due to rapid development of transmission technology, wireless communication technology and other associated technologies. A telemonitoring system for patients in a telemedical care system primarily provides home care services for patients with chronic diseases, making them more actively involved in their self-health management. By these technologies, physiological conditions such as ECG signal, blood pressure, body temperature, blood sugar and other physiological messages of a home medical care user are transmitted through networks to a central database for storage and for establishing a personal physiological database. As long as there is an abnormal change of the physiological messages, a warning signal is generated and a medical treatment proceeds.

The above telemdical care system when actually measuring signals is usually affected by noise interferece on human body or wire sensing, thereby causing signal distortion and deteriorating wire efficacy. A notch filter is thus added in a sensing channel to filtering off interfering noises, such as mains signals. Alternatively, a band-pass filter is used to retrieve required signal bands and output signals to be retrieved, such as R wave signals in ECG signals or channel signals in a communcation system. FIGS. 1 and 2 show a sencing channel filter circuit of a conventional telemdical care system, that is, an analog front end circuit in the example of a second order filter circuit. A basic structure of the sencing channel filter circuit is shown in FIG. 1, which includes: a preamplifier 10, a low-pass filter 11, a notch filter 12, a post-amplifier 14, and an A/D converter 15. FIG. 2 differs from FIG. 1 in having a band-pass filter 13 in place of the notch filter 12 in FIG. 1. Signals are firstly amplified by the preamplifier 10, and then high frequency noises and interfering signals are filtered off therefrom by the low-pass filter 11 and the notch filter 12 (or band-pass filter 13) respectively. The post-amplifier 14 amplifies amplitudes of the retrieved signals that are the outputted to the A/D converter 15 where the retrieved signals are converted to digital signals, which then undergo DSP (digital signal processing) by a back end of the telemdical care system.

However, a center frequency of the notch filter 12 or band-pass filter 13 shown in FIGS. 1 and 2 is affected to have deviation by process (P), voltage (V), temperature (T) and usage time. In this case, the filters 12 and 13 cannot effectively filter off interfering noises or retrieve desired signals, and signals thus being sensed would encouter unexpected attenuation.

Therefore, how to propose a new filtering technology using the above analog front end circuit as a sensing channel to effectively correct the center frequency of the notch filter 12 or band-pass filter 13 is an important topic in the art.

SUMMARY OF THE INVENTION

In view of the above drawbacks of the conventional technology, a primary object of the invention is to provide a low order filter circuit having a frequency correction function, a frequency correction method for the low order filter circuit, and a high order filter circuit, which may perform frequency correction on a notch filter or a band-pass filter in the circuit, so as to eliminate deviation of a center frequency of the notch or band-pass filter caused by influence from process, voltage, temperature and usage time in the conventional technology.

Another object of the invention is to provide a new high order filter circuit, which is made up of the low order filter circuits of the invention in the form of a cascade or ladder-type structure, and is applied in a telemdical care system to prevent unexpected attenuation of signals from being sensed by the system.

To achieve above object and other object, the invention is to provide a low order filter circuit having a frequency correction function, including: a second order filter unit for receiving an inputted signal and filtering the inputted signal to retrieve a predetermined band signal and output the predetermined band signal; an analog-to-digital converter (ADC) having a first working status and a second working status, for detecting a peak of the predetermined band signal from the second order filter unit and digitalizing the peak when the ADC is in the first working status, and for detecting and converting the predetermined band signal from the second order filter unit to a digital signal and outputting the digital signal when the ADC is in the second working status; and a digital correction unit for comparing the digitalized peak with a default value and generating a comparison result, and according to the comparison result, the digital correction unit generating a frequency control signal and a working status control signal and sending them as feedbacks respectively to the second order filter unit for adjusting its working frequency and to the ADC for switching its working status.

Preferably, the second order filter unit of the invention is a second order notch filter unit or a second order band-pass filter unit, and the working frequency is a notch center frequency of the notch filter unit or a band-pass center frequency of the band-pass filter unit.

Preferably, the second order notch filter unit of the invention includes a preamplifier, a low-pass filter, a notch filter and a post-amplifier, which are connected in a cascade.

Preferably, the second order band-pass filter unit of the invention includes a preamplifier, a low-pass filter, a band-pass filter and a post-amplifier, which are connected in a cascade.

Preferably, the second order filter unit of the invention is made up of an operational transconductance amplifier (OTA). The working frequency of the second order filter unit is adjusted by changing transconductance of the OTA.

Preferably, the digital correction unit of the invention includes: a register unit for storing the digitalized peak; a comparison unit for comparing the digitalized peak with the default value and generating a comparison result; a control unit for generating the working status control signal and a counting mode control signal according to the comparison result from the comparison unit; and a counting unit for performing forward or backward counting according to the counting mode control signal from the control unit to generate the frequency control signal.

The invention further provides a frequency correction method for the low order filter circuit, including the steps of: in step S1, setting an initial frequency control signal via the counting unit, and with the initial frequency control signal, allowing the ADC to detect a peak of a predetermined band signal outputted from the second order filter unit and digitalize the peak to form a first digitalized peak that is stored in the register unit and serves as the default value; in step S2, using the counting unit to continuously form a next frequency control signal, and with this frequency control signal, allowing the ADC to detect a peak of a predetermined band signal outputted from the second order filter unit and digitalize the peak to form a second digitalized peak that is outputted to and stored in the register unit; in step S3, having the comparison unit compare the second digitalized peak formed in step S2 with the first digitalized peak formed in step S1 and generate a comparison result, wherein if the comparison result matches a predetermined setting then step S4 is executed, the control unit operates to have the counting unit stay in a current counting mode without changing its counting direction and then to generate and send a working status control signal to the second order filter unit for adjusting its working frequency, and the comparison unit keeps performing comparison; and if the comparison result does not match the predetermined setting then step S5 is executed, the control unit operates to change the counting mode of the counting unit in a way of changing its counting direction to count reversely and then to generate and send a working status control signal to the second order filter unit for adjusting its working frequency then step S6 is executed; in step S6, determining if a number of times for the counting unit to change its counting mode has reached a predetermined number, if yes, ending the method; if no, returns step S3.

Preferably, in step S2 of the frequency correction method for the low order filter circuit, the second order filter unit is a second order notch filter unit, and in the step of having the comparison unit compare the second digitalized peak formed in step S2 with the first digitalized peak formed in step S1, if the second digitalized peak is smaller than the first digitalized peak, it means the comparison result matches the predetermined setting; or the second order filter unit is a second order band-pass filter unit, and in the step of having the comparison unit compare the second digitalized peak formed in step S2 with the first digitalized peak formed in step S1, if the second digitalized peak is larger than the first digitalized peak, it means the comparison result matches the predetermined setting.

The invention further provides a high order filter circuit. The high order filter circuit proposed in the invention is made up of the low order filter circuits, including: a plurality of second order filter units for filtering inputted signals; a plurality of switch units for connecting the plurality of second order filter units in a cascade to form a high order filter unit when the switch units are closed, and for restoring the high order filter unit to the plurality of second order filter units when the switch units are opened; an analog-to-digital converter (ADC) having a first working status and a second working status, for detecting peaks of predetermined band signals outputted from the second order filter units and digitalizing the peaks when the ADC is in the first working status, and for detecting and converting the predetermined band signals from the second order filter units to digital signals and outputting the digital signals when the ADC is in the second working status; and a digital correction unit for comparing the digitalized peaks with a default value and generating comparison results, and according to the comparison results, the digital correction unit generating frequency control signals and working status control signals and sending them as feedbacks respectively to the second order filter units for adjusting their working frequencies and to the ADC for switching its working status.

In summary, the invention may correct a working frequency of a second order filter unit in the low order filter circuit. If the second order filter unit is a notch filter unit, the working frequency is its notch center frequency. If the second order filter unit is a band-pass filter unit, the working frequency is its band-pass center frequency. This may eliminate the drawbacks caused by center frequency deviation of a notch or band-pass filter in the conventional notch or band-pass filter circuit.

Furthermore, the high order filter circuit proposed in the invention is made up of the low order filter circuits having a frequency correction function in the form of a cascade or ladder-type structure. By this structure, switch units in the high order filter circuit may divide it into a plurality of the low order filter circuits for which frequency correction can be performed through the frequency correction method of the invention. After the frequency correction is done, the switch units may connect all the second order filter circuits to form the original high order filter circuit for signal detection. The invention significantly simplifies frequency correction operations for filter units (notch or band-pass filter units) in the high order filter circuit, and greatly improves integrity of the high order filter circuit, thereby achieving desirable effects such as delicate designing and power saving. Moreover, the high order filter circuit of the invention can be widely applied in any product or system requiring high signal quality, for example, telemedical care system, so as to avoid unexpected attenuation of signals sensed by the system.

The objects, technical disclosures and features of the invention and effects achieved thereby would be more clearly understood from the following detailed description of the preferred embodiments taken in conjunction with the accompanying drawings.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Figure 1:
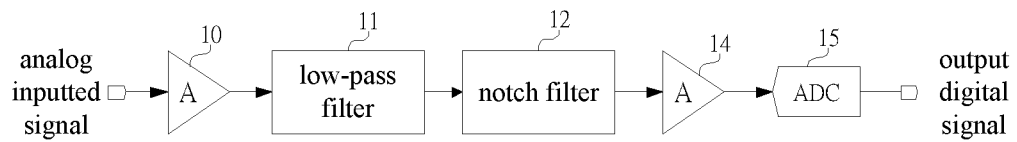
FIGS. 1 and 2 are schematic diagrams showing basic structures of a conventional second order filter circuit.
Figure 2:
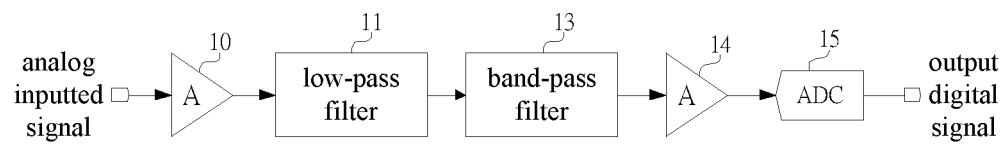

Embodiments of the present invention will now be described in detail with reference to the accompanying drawings. The invention may, however, be embodied in many different forms and should not be construed as being limited to the embodiments set forth herein. Rather, these embodiments are provided so that this disclosure will be thorough and complete, and will fully convey the scope of the invention to those skilled in the art. In the drawings, the shapes and dimensions of elements may be exaggerated for clarity, and the same reference numerals will be used throughout to designate the same or like components.

The invention provides a low order filter circuit having a frequency correction function, a frequency correction method for the low order filter circuit, and a high order filter circuit formed by the low order filter circuits. In the invention, the low order filter circuit and high order filter circuit include at least a notch or band-pass filter unit. In order to prevent a working frequency of the notch or band-pass filter unit (that is, a notch center frequency of the notch filter unit or a band-pass center frequency of the band-pass filter unit) from deviating from a reference frequency as being affected by process, temperature, voltage and usage time, the following embodiments are depicted by adding digital correction technology to a conventional filter circuit, so as to adjust the working frequency of the notch or band-pass filter unit, and thereby filter off interfering noises from inputted signals or desirably retrieve required inputted signals.

Figure 3:
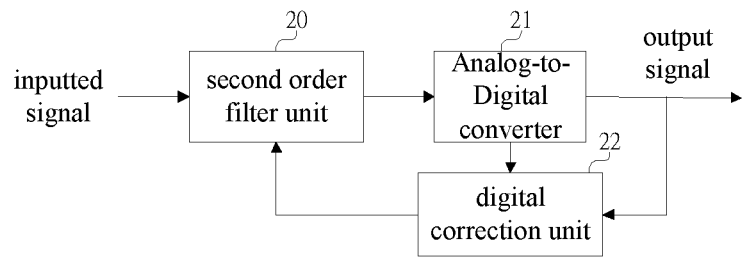
FIG. 3 is a structural schematic diagram showing a low order filter circuit having a frequency correction function according to the invention.

FIG. 3 shows a basic structural schematic diagram showing a low order filter circuit having a frequency correction function according to the invention. Referring to FIG. 3, the low order filter circuit includes: a second order filter unit 20, an ADC (Analog-to-Digital converter) 21, and a digital correction unit 22, which are to be described in detail as follows.

The second order filter unit 20 is used to perform a filtering process on an inputted signal (analog inputted signal) to filter off interfering noises from the inputted signal and retrieve a predetermined band signal.

The ADC 21 is connected to the second order filter unit 20 and has a peak detection function operating at first and second working statuses. In the first working status, the ADC 21 may detect a peak of the predetermined band signal and digitalize the peak, and output the digitalized peak. In the second working status, the ADC 21 may convert the predetermined band signal to a digital signal and output the digital signal.

The digital correction unit 22 is used to compare the digitalized peak outputted from the ADC 21 with a default value, and generate a frequency control signal according to the comparison result and send it as a feedback to the second order filter unit 20 for adjusting on its working frequency. The digital correction unit 22 is further used to generate a working status control signal and send it as a feedback to the ADC 21 for switching its working status.

Figure 4:
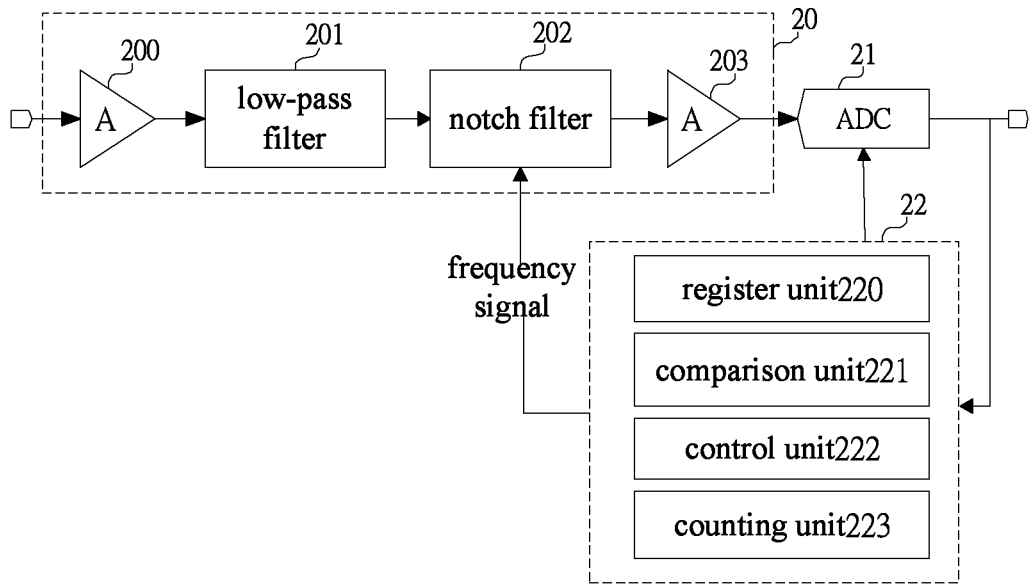
FIGS. 4 and 5 are schematic diagrams showing preferred embodiments of the low order filter circuit of FIG. 3.
Figure 5:
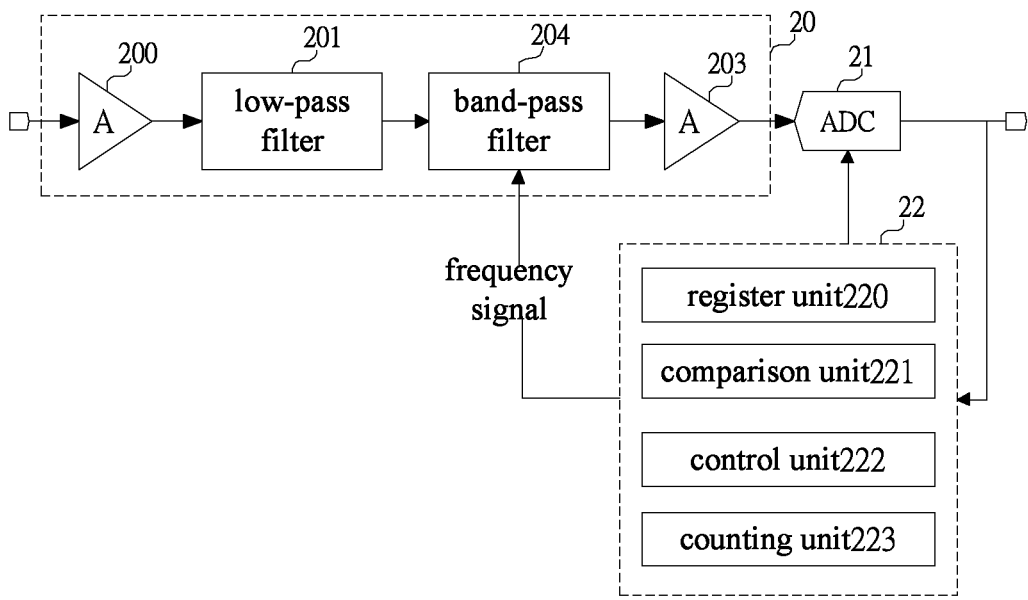

FIGS. 4 and 5 show circuit structures of preferred embodiments of the low order filter circuit of FIG. 3 respectively, wherein FIG. 5 differs from FIG. 4 in having a band-pass filter 204 in place of a notch filter 202 of FIG. 4. As shown in FIGS. 4 and 5, the second order filter unit 20 of FIG. 3 includes: a preamplifier 200, a low-pass filter 201, the notch filter 202 (or the band-pass filter 204 shown in FIG. 5), and a post-amplifier 203. The above inputted signal is firstly amplified by the preamplifier 200, and then high frequency noises and interfering signals are filtered off therefrom by the low-pass filter 201 and the notch filter 202 or band-pass filter 204 to obtain the predetermined band signal. Then, the post-amplifier 203 also amplifies the predetermined band signal to be outputted to the ADC 21. The ADC 21 may perform the following processes on the predetermined band signal: detecting the peak of the predetermined band signal and digitalizing the peak to be outputted to the digital correction unit 22, or converting the predetermined band signal to the digital signal to be outputted to a subsequent circuit.

Further referring to FIGS. 4 and 5, the digital correction unit 22 of the invention is used to perform comparison and determination on the digitalized peak outputted from the ADC 21 so as to generate the frequency control signal for controlling adjustment on the working frequency of the notch or band-pass filter and to generate the working status control signal for controlling the ADC to switch its working status. As shown in the figures, the digital correction unit 22 includes: a register unit 220, a comparison unit 221, a control unit 222 and a counting unit 223. The register unit 220 is used to store the digitalized peak outputted from the ADC 21. The comparison unit 221 is used to compare the digitalized peak with the default value. The control unit 222 is used to generate the working status control signal and a counting mode control signal according to the comparison result from the comparison unit 221. The counting unit 223 is used to perform forward or backward counting according to the counting mode control signal from the control unit 222 so as to generate the frequency control signal and send it as a feedback to the notch filter 202 in FIG. 4 or the band-pass filter 204 in FIG. 5, for allowing the notch filter 202 or band-pass filter 204 to adjust its notch center frequency or band-pass center frequency.

The invention also discloses a frequency correction method for the low order filter circuit, which includes two correction methods respective for the second order notch filter unit and the second order band-pass filter unit. The correction method for the second order notch filter unit is to input a signal of reference frequency (that is, the above inputted signal) to the second order notch filter unit that is to be corrected. The second order notch filter unit retrieves a predetermined band signal from the inputted signal and outputs it to the ADC 21 having a peak detecting function where a peak of the predetermined band signal outputted from the second order notch filter unit is detected and digitalized. Then the digital correction unit 22 compares the digitalized peak of the second order notch filter unit with a pre-adjusted digital peak (considered as the default value), and makes determination to output a digital code (Xn) as a frequency control signal and send it as a feedback to the second order notch filter unit where adjustment is performed.

Moreover, the correction method for the second order band-pass filter unit is to input a signal of reference frequency (that is, the above inputted signal) to the second order band-pass filter unit that is to be corrected. The second order band-pass filter unit retrieves a predetermined band signals from the inputted signal and outputs it to the ADC 21 having a peak detecting function where a peak of the predetermined band signal outputted from the second order band-pass filter unit is detected and digitalized. Then the digital correction unit 22 compares the digitalized peak of the second order band-pass filter unit with a pre-adjusted digital peak (considered as the default value), and makes determination to output a digital code (Xn) as a frequency control signal and sends it as a feedback to the second order band-pass filter unit where adjustment is performed. Further, the digital correction unit 22 generates a working status control signal and sends it as a feedback to the ADC 21 where its working status may be switched. The working status switching process of the ADC 21 is performed as follows: if the digital correction unit determines according to the comparison result that the second order notch or band-pass filter unit has completed its center frequency correction, the working status control signal from the digital correction unit allows the ADC 21 to switch to its second working status; otherwise, the working status control signal from the digital correction unit allows the ADC 21 to stay in its first working status and carry out the signal peak detecting function.

Figure 6:
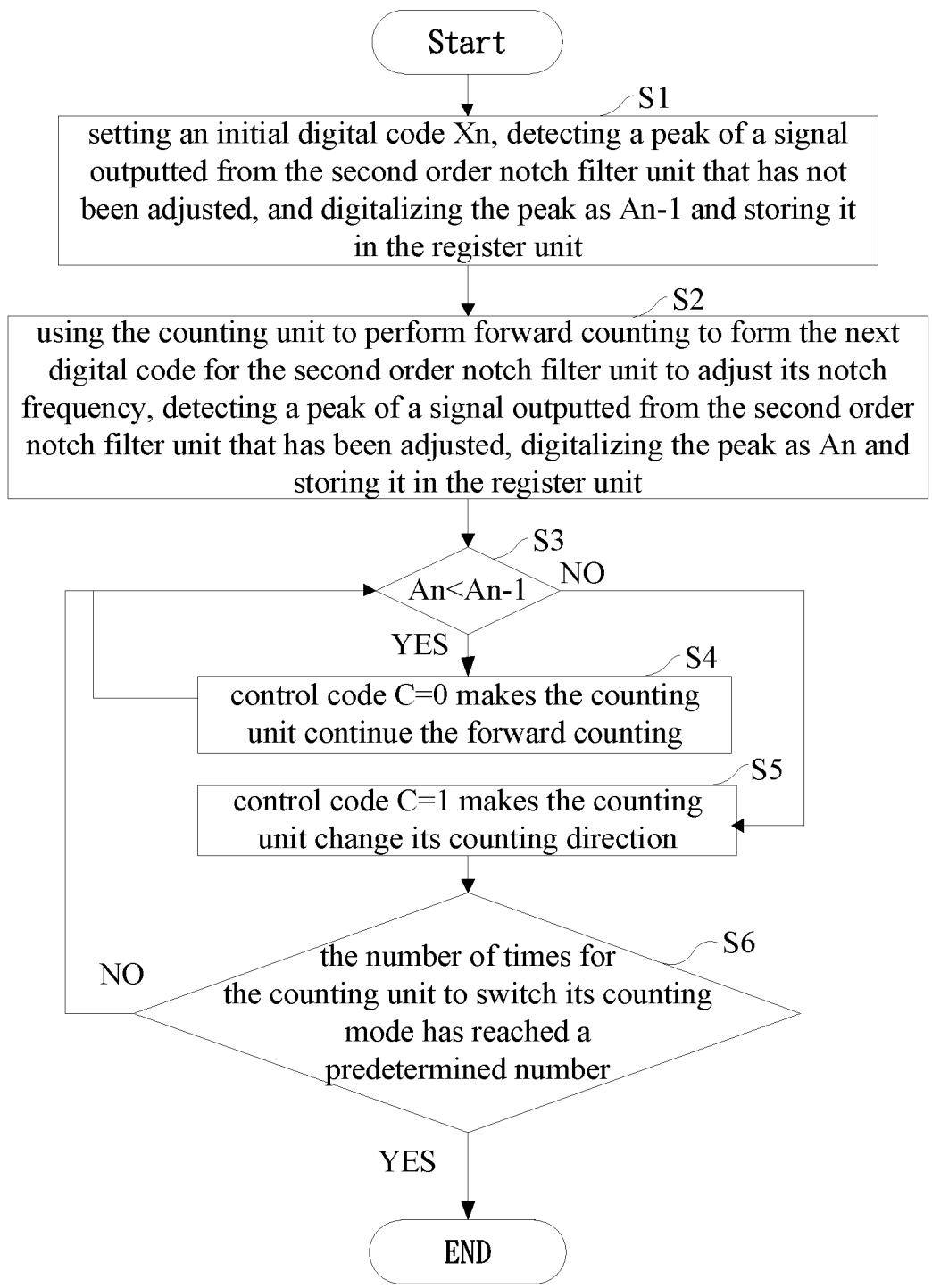
FIGS. 6 and 8 are flow charts of a frequency correction method for a low order notch filter circuit and for a low order band-pass filter circuit respectively according to the invention.

A correction method for a notch center frequency of the notch filter 202 for the second order filter circuit in FIG. 4 is described in detail below. As shown in FIG. 6, the correction method includes the following steps.

First in step S1, the counting unit 223 sets a digital code (Xn) (for example, a four-digits code) as 1000, which serves as an initial frequency control signal. With the initial frequency control signal, the ADC detects a peak of a predetermined band signal outputted from the second order notch filter unit, digitalizes the peak, and stores the digitalized peak as a default value An−1 in the register unit 220 (that is a peak digitalized value An−1 of the second order notch filter unit before any adjustment is performed on its notch center frequency). The control unit 222 generates a counting mode control signal (C) such as 0 to allow the counting unit 223 to count up (that is, forward counting), so the next digital code Xn is 1001. Then, step S2 is executed.

In step S2, the counting unit 223 counts up, and the next digital code Xn is 1001. With this digital code, the second order notch filter unit performs adjustment on its notch center frequency. The ADC 21 detects a peak of a predetermined band signal outputted from the second order notch filter unit after the frequency adjustment is done, and digitalizes the peak and stores the digitalized peak An in the register unit 220. Then step S3 is executed.

In step S3, the comparison unit 221 compares the digitalized peak An with the default value An−1. If An is smaller than An−1, it means that the outputted peak from the second order notch filter unit after adjusting its notch center frequency tends to become smaller, so step S4 is executed to continue correction of the notch center frequency in a single direction. The control unit 222 outputs a control code C=0 (Keep mode) to the counting unit 223 where the digital code Xn is counted in the same direction and sent to the second order notch filter unit, and meantime the counting unit 223 is counting up (forward counting). Return to step S3 where the comparison process is continued. If An is larger than An−1, it means that the outputted peak from the second order notch filter unit after adjusting its notch center frequency is getting larger. The digital correction unit 22 determines that the counting unit 223 is counting in a wrong direction, and step S5 is executed such that the control unit 222 outputs a control code C=1 (Change mode) to allow the counting unit 223 to count reversely (backward counting) the digital code and send it to the second order notch filter unit where adjustment of the notch center frequency is performed.

In step S6, it determines if the number of times for the counting unit 223 to switch its counting mode has reached a predetermined number. If yes, the correction method is completed. If no, the correction method is continued and returns to step S3. According to the frequency correction mechanism of the invention, eventually three records of data would appear for back and forth adjustment. This then requires a mechanism to fix the notch center frequency being adjusted at a median value. In such case, the predetermined number of times of counting mode switching is set 3, such that when the counting unit 223 has switched its counting mode three times, the second order notch filter unit would complete its correction, that is, the correction method shown in FIG. 6 ends.

Figure 7:
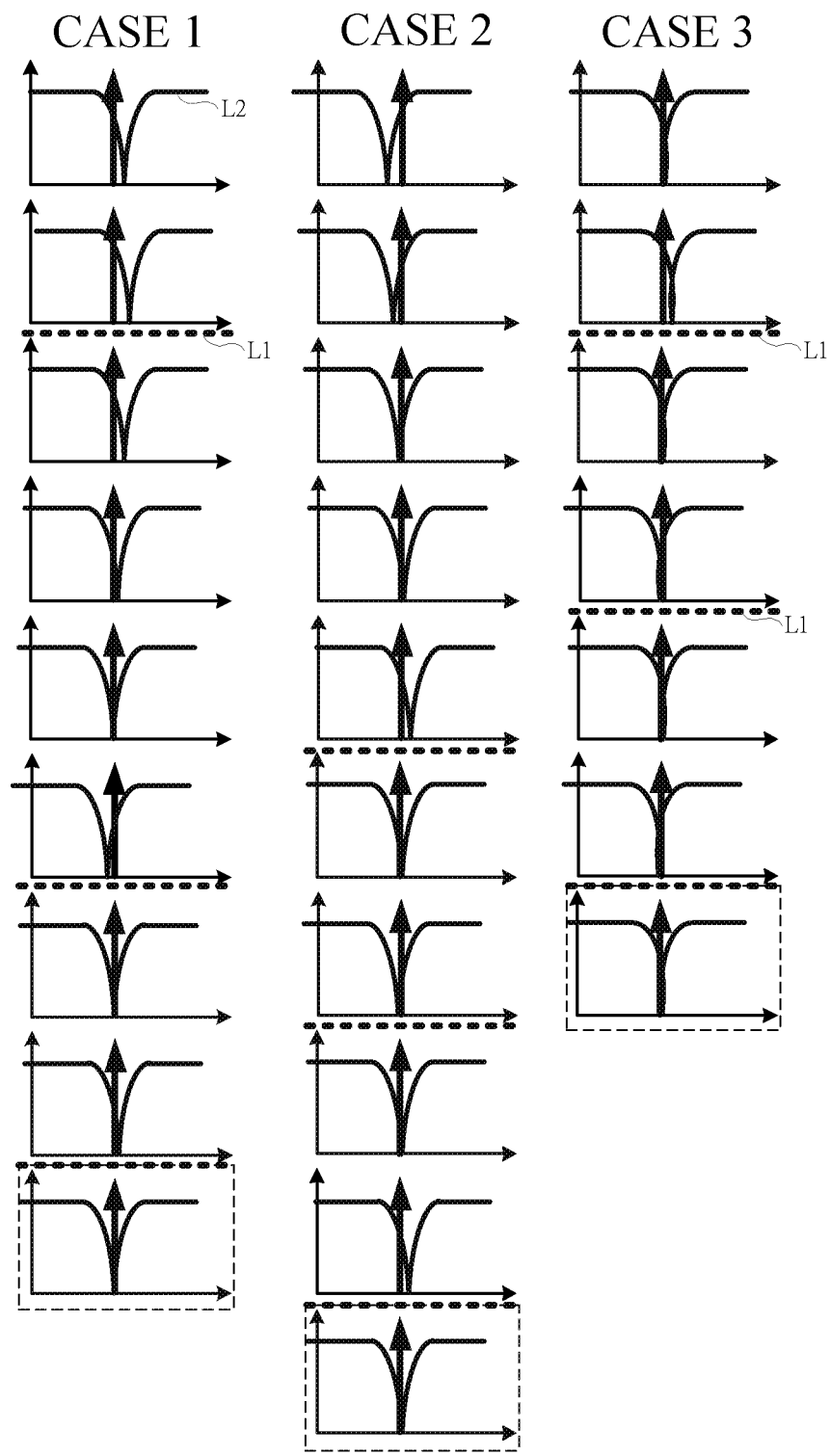
FIGS. 7 and 9 are schematic diagrams respectively showing deviation of a center frequency of a second order notch filter circuit and of a second order band-pass filter circuit according to the invention.

FIG. 7 shows deviation of the notch center frequency of the second order notch filter circuit during the correction process. Case 1 shows correction being performed on the filter unit's notch center frequency that has deviated towards a high frequency direction. Case 2 shows correction being performed on the filter unit's notch center frequency that has deviated towards a low frequency direction. Case 3 shows the shortest process of correcting the filter unit. These three types of cases all stop when the counting unit has switched its counting mode three times. (Please note: dotted line L1 means timing of the counting unit 223 switching its counting mode; solid line L2 is frequency response of the notch filter unit; bold arrow is frequency of reference signal)

Figure 8:
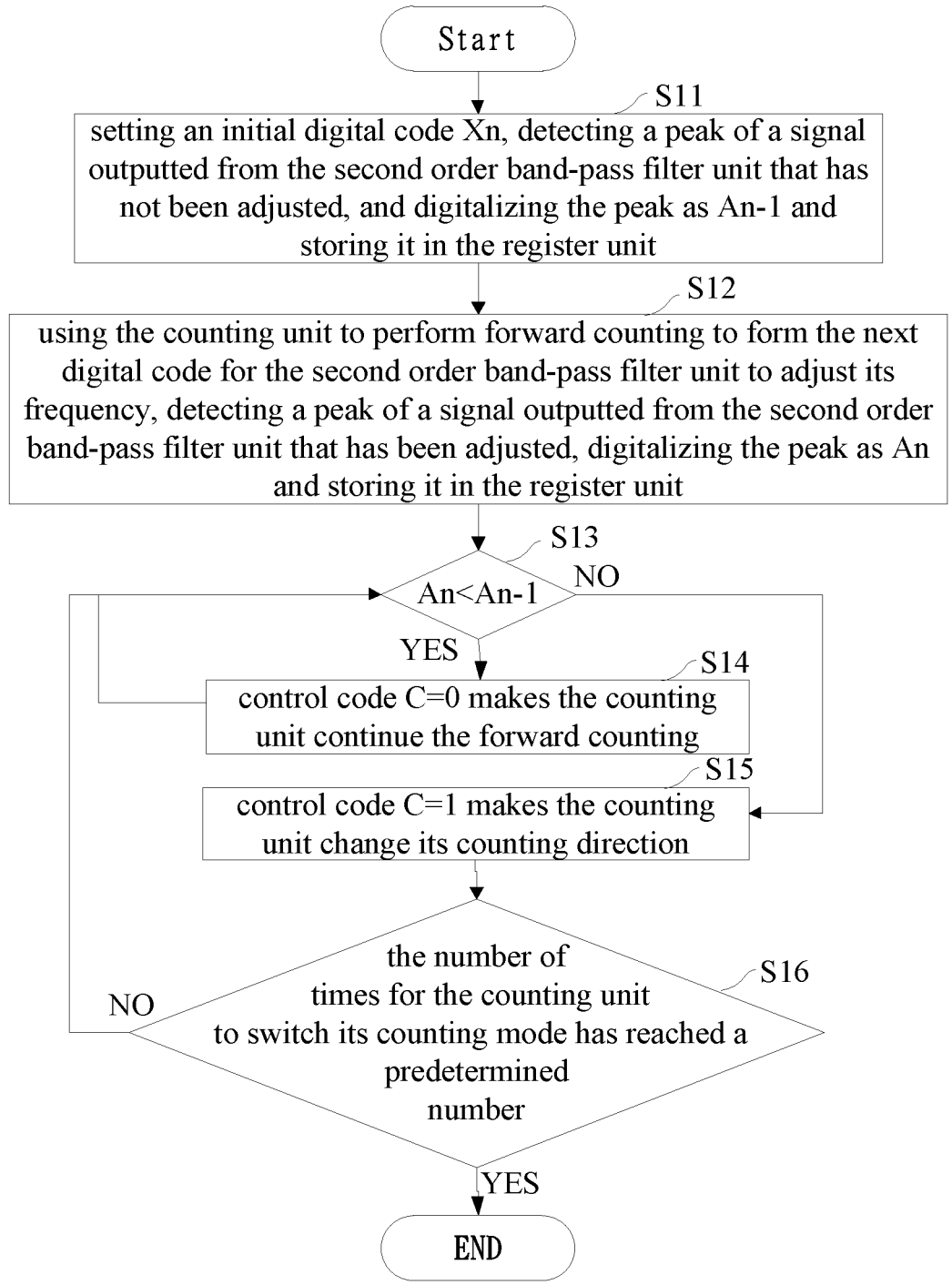

A correction method for the second order band-pass filter circuit is described below with reference to FIGS. 5 and 8. The correction method includes the following steps.

First in step S11, the counting unit 223 sets a digital code (Xn) (for example, a four-digits code) as 1000, which serves as an initial frequency control signal. With the initial frequency control signal, the ADC detects a peak of a predetermined band signal outputted from the second order band-pass filter unit, digitalizes the peak, and stores the digitalized peak as a default value An−1 in the register unit 220 (that is a peak digitalized value An−1 of the second order band-pass filter unit before any adjustment is performed on its band-pass center frequency). The control unit 222 generates a counting mode control signal (C) such as 0 to allow the counting unit 223 to count up (that is, forward counting), so the next digital code Xn is 1001. Then, step S12 is executed.

In step S12, the counting unit 223 counts up, and the next digital code Xn is 1001. With this digital code, the second order band-pass filter unit performs adjustment on its center frequency. The ADC 21 detects a peak of a predetermined band signal outputted from the second order band-pass filter unit after the frequency adjustment is done, and digitalizes the peak and stores the digitalized peak An in the register unit 220. Then step S13 is executed.

In step S13, the comparison unit 221 compares the digitalized peak An with the default value An−1. If An is larger than An−1, it means that the outputted peak from the second order band-pass filter unit after adjusting its frequency tends to become larger, so step S14 is executed to continue correction of the center frequency of the second order band-pass filter unit in a single direction. The control unit 222 outputs a control code C=0 (Keep mode) to the counting unit 223 where the digital code Xn is counted in the same direction and sent to the second order band-pass filter unit, and meantime the counting unit 223 is counting up (forward counting). Return to step S13 where the comparison process is continued. If An is smaller than An−1, it means that the outputted peak from the second order band-pass filter unit after adjusting its center frequency is getting smaller. The digital correction unit 22 determines that the counting unit 223 is counting in a wrong direction, and step S15 is executed such that the control unit 222 outputs a control code C=1 (Change mode) to allow the counting unit 223 to count reversely (backward counting) the digital code and send it to the second order band-pass filter unit where frequency adjustment is performed.

In step S16, it determines if the number of times for the counting unit 223 to switch its counting mode has reached a predetermined number. If yes, the correction method is completed. If no, the correction method is continued and returns to step S13. According to the frequency correction mechanism of the invention, eventually three records of data would appear for back and forth adjustment. This then requires a mechanism to fix the adjusted center frequency of the second order band-pass filter unit at a median value. In such case, the predetermined number of times of counting mode switching is set 3, such that when the counting unit has switched its counting mode three times, the band-pass filter unit would complete its correction, that is, the correction method shown in FIG. 8 ends.

Figure 9:
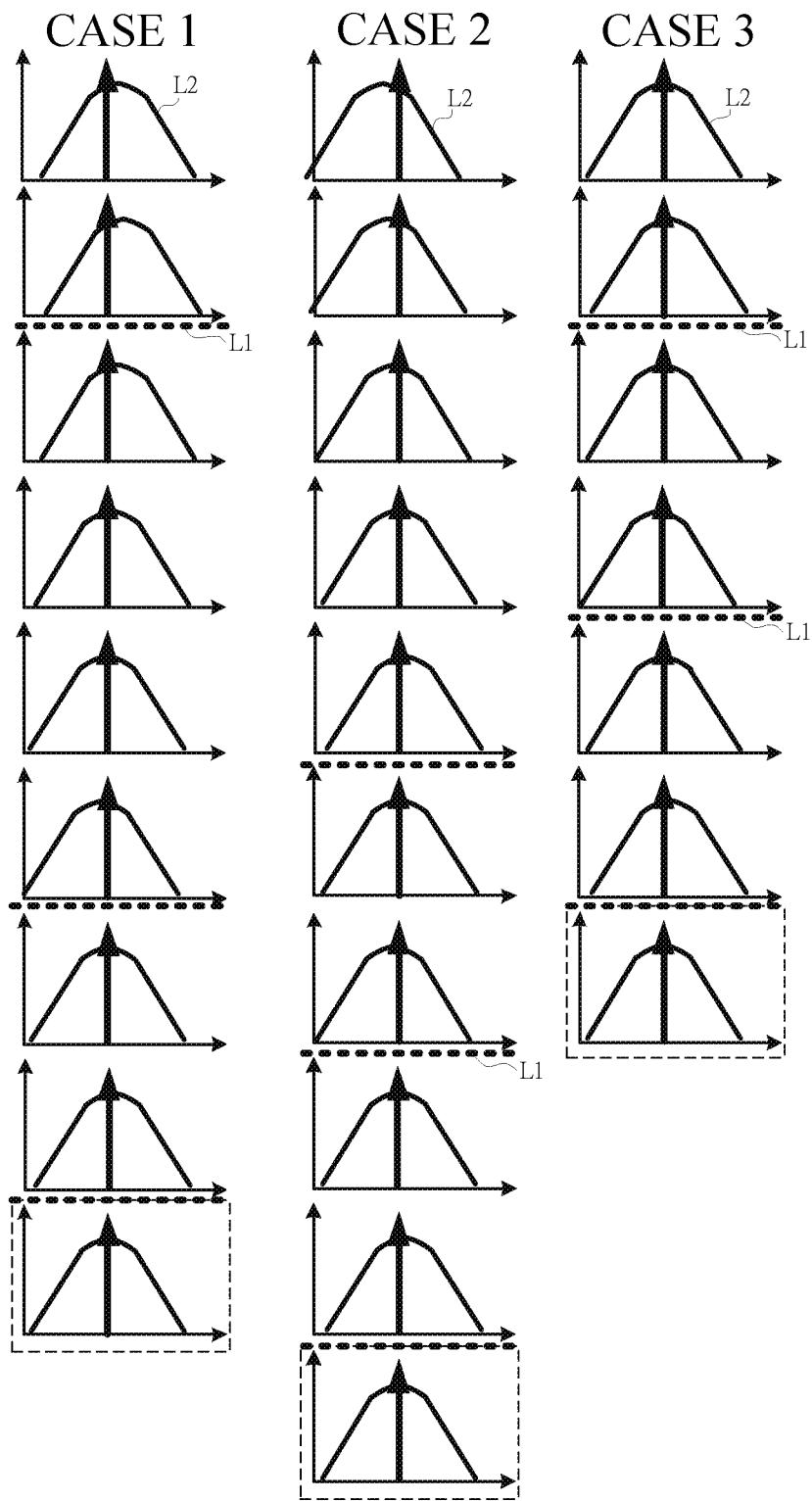

FIG. 9 shows deviation of the center frequency of the second order band-pass filter circuit during the correction process. Case 1 shows correction being performed on the filter unit's center frequency that has deviated towards a high frequency direction. Case 2 shows correction being performed on the filter unit's center frequency that has deviated towards a low frequency direction. Case 3 shows the shortest process of correcting the filter unit. These three types of cases all stop when the counting unit 223 has switched its counting mode three times. (Please note: dotted line L1 means timing of the counting unit switching its counting mode; solid line L2 is frequency response of the band-pass filter unit; bold arrow is frequency of reference signal)

The invention also proposes a high order filter circuit. The high order filter circuit is subject to transfer function analysis, and it is found that a notch center frequency of a high order notch filter or a center frequency of a high order band-pass filer is determined by multiple sets of parameter combinations. The invention thus utilizes the above low order filter circuit and switch units to design the high order filter circuit. The high order filter circuit includes: a high order filter unit, a plurality of switch units, an ADC and a digital correction unit. The high order filter unit includes a plurality of second order filter units for filtering inputted signals. The plurality of switch units are used to, when they are closed, connect the second order filter units in a cascade to form the high order filter unit, and when they are opened, divide the high order filter unit into the plurality of second order filter units. The ADC has a first working status and a second working status. When it is in the first working status, the ADC detects a peak of a predetermined band signal outputted from the second order filter unit and digitalizes the peak. When it is in the second working status, the ADC converts the predetermined band signal to a digital signal for being outputted. The digital correction unit is used to compare the digitalized peak with a default value, and generate a frequency control signal and a working status control signal according to the comparison result and send them respectively as feedbacks to the second order filter unit for adjusting its working frequency and to the ADC for switching its working status. When the high order filter unit is structurally formed, during frequency correction, the switch units may work in a way to divide the original high order filter unit into multiple sets of second order filters (such as the second order filters shown in FIGS. 3, 4 and 5). Then the correction method shown in FIG. 6 or 8 proceeds to sequentially correct each set of the second order filters. When all the second order filters are corrected, the switch units connect the second order filters to form the original high order filter unit for signal detection. The filter may be constructed by transconductance-C(OTA-C). Frequency correction or adjustment is performed by changing transconductance (Gin) of an operational transconductance amplifier (OTA) to change a notch or band-pass center frequency of the filter.

Figure 10:
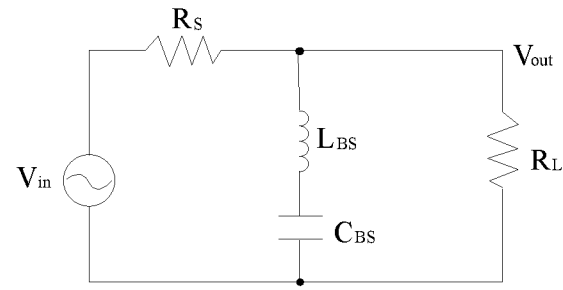
FIGS. 10 and 11 are respectively an RLC structure circuit diagram of the low order filter circuit and a circuit diagram of a second order OTA filter circuit equivalent to the RLC circuit according to the invention.
Figure 11:
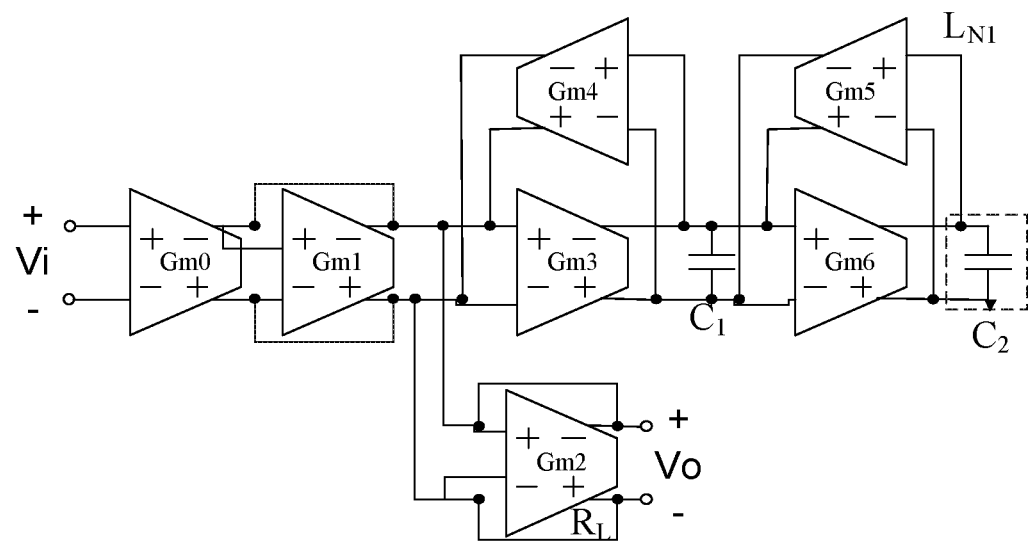
Figure 12:
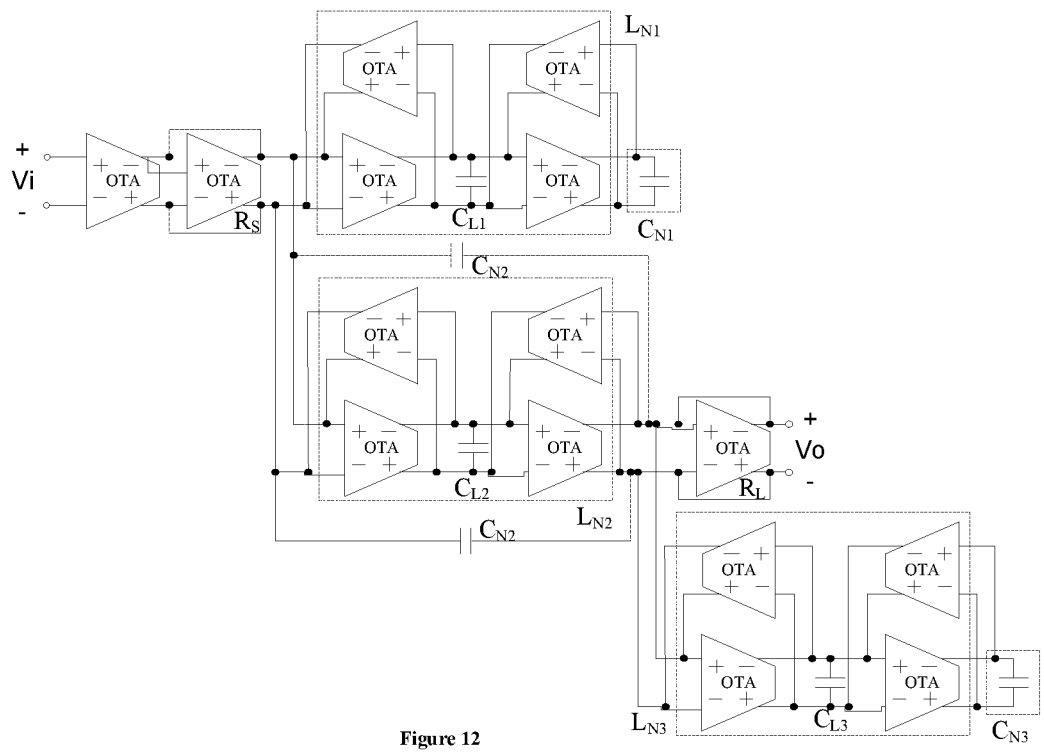
FIG. 12 is a circuit diagram of a sixth order ladder-type notch filter according to the invention.

FIG. 10 is an RLC circuit diagram of the second order notch filter unit in the low order notch filter circuit shown in FIG. 4. FIG. 11 is a circuit diagram of a second order OTA notch filter unit formed by using an OTA and capacitance to equivalently replace a passive component shown in FIG. 10. The invention integrates the above digital correction technology and digital switches (that is, switch units described below) on the basis of the technologies shown in FIGS. 10 and 11 to form the high order notch filter circuit. For example, a sixth order ladder-tye OTA notch filter circuit is shown in FIG. 12. For the circuit, equations (1.1), (1.2), (1.3), (1.4), (1.5) are listed out through KCL and KVL, allowing relation equations (1.6), (1.7), (1.8) to be derivated and then introduced into equation (1.5) to obtain equation (1.9), which is then subject to transfer function to get equation (1.10).

$$\begin{cases} I_0 = v_i \cdot G_{m0} \\ I_1 = v_x \cdot G_{m1} \\ I_2 = v_o \cdot G_{m2} \\ I_x = (v_x - v_o) \cdot sC_4 \end{cases} \quad (1.1)$$

$$\begin{cases} I_3 = v_x \cdot G_{m3} \\ I_4 = v_1 \cdot G_{m4} \\ I_5 = v_2 \cdot G_{m5} \\ I_6 = v_1 \cdot G_{m6} = v_2 \cdot sC_2 \end{cases} \quad (1.2)$$

$$\begin{cases} I_7 = v_x \cdot G_{m7} \\ I_8 = v_3 \cdot G_{m8} \\ I_9 = v_o \cdot G_{m9} \\ I_{10} = v_3 \cdot G_{m10} \end{cases} \quad (1.3)$$

$$\begin{cases} I_{11} = v_o \cdot G_{m11} \\ I_{12} = v_5 \cdot G_{m12} \\ I_{13} = v_6 \cdot G_{m13} \\ I_{14} = v_5 \cdot G_{m14} = v_6 \cdot sC_6 \end{cases} \quad (1.4)$$

$$\begin{cases} I_0 = I_1 + I_4 + I_x + I_8 \\ I_{10} + I_x = I_2 + I_{12} \end{cases} \quad (1.5)$$

$$\begin{cases} I_4 = v_1 \cdot G_{m4} \\ I_3 = v_1 \cdot sC_1 + I_5 \\ v_x \cdot G_{m3} = v_1 sC_1 + \dfrac{v_1 G_{m6}}{sC_2} \cdot G_{m5} \\ v_1 = v_x G_{m3}\left(\dfrac{1}{sC_1 + \dfrac{G_{m5}G_{m6}}{sC_2}}\right) \end{cases} \quad (1.6)$$

$$\begin{cases} I_{12} = v_5 \cdot G_{m12} \\ I_{11} = v_5 \cdot sC_5 + I_{13} \\ v_o \cdot G_{m11} = v_5 sC_5 + \dfrac{v_5 G_{m14}}{sC_6} \cdot G_{m13} \\ v_5 = v_o G_{m11}\left(\dfrac{1}{sC_5 + \dfrac{G_{m13}G_{m14}}{sC_6}}\right) \end{cases} \quad (1.7)$$

-continued $$\begin{cases} I_7 = v_3 s C_3 + I_9 \\ v_x \cdot G_{m7} = v_3 s C_3 + v_o \cdot G_{m9} \\ v_3 = \dfrac{v_x \cdot G_{m7} - v_o \cdot G_{m9}}{s C_3} \end{cases} \quad (1.8)$$

$$\begin{cases} v_i \cdot G_{m0} = v_x \cdot G_{m1} + \left( \dfrac{v_x G_{m3}}{s C_1 + \dfrac{G_{m5} G_{m6}}{s C_2}} \right) G_{m4} + \\ (v_x - v_o) \cdot s C_4 + \left( \dfrac{v_x \cdot G_{m7} - v_o \cdot G_{m9}}{s C_3} \right) G_{m8} \\ \left( \dfrac{v_x \cdot G_{m7} - v_o \cdot G_{m9}}{s C_3} \right) G_{m10} + \\ (v_x - v_o) \cdot s C_4 = v_o \cdot G_{m2} + \left( \dfrac{v_o G_{m11}}{s C_5 + \dfrac{G_{m13} G_{m14}}{s C_6}} \right) \cdot G_{m12} \end{cases} \quad (1.9)$$

$$T(s) = \frac{v_o}{v_i} = \frac{D(s)}{N(s)} = \frac{a_0(s^2+c_1)(s^2+c_2)(s^2+c_3)}{b_6 s^6 + b_5 s^5 + b_4 s^4 + b_3 s^3 + b_2 s^2 + b_1 s + b_0} \quad (1.10)$$

With the use of software (Mathematica.7.0.0), some coefficients of the transfer function are obtained, among which a0, b6, b5, b4, b3, b2, b1, b0, c3, c2, c1 are shown below.

$$a_0 = G_{m0} C_1 C_2 C_3 C_4 C_5 C_6$$

$$b_6 = C_1 C_2 C_3 C_4 C_5 C_6 (G_{m1} + G_{m2})$$

$$b_5 = C_2 C_6 \{C_3 C_4 C_5 G_{m3} G_{m4} + C_1 [C_4 C_5 (G_{m7} - G_{m9})(G_{m8} - G_{m10}) + \\ C_3 (C_5 G_{m1} G_{m2} + C_4 G_{m11} G_{m12})]\}$$

$$b_4 = C_3 C_4 C_5 C_6 G_{m5} G_{m6} (G_{m1} + G_{m2}) + \\ C_2 \{C_1 C_5 C_6 (G_{m2} G_{m7} G_{m8} + G_{m1} G_{m9} G_{m10}) C_3 [C_5 C_6 G_{m2} G_{m3} G_{m4} + \\ C_1 (C_6 G_{m1} G_{m11} G_{m12} + C_4 G_{m13} G_{m14} (G_{m1} + G_{m2}))]\}$$

$$b_3 = C_2 C_6 (C_5 G_{m3} G_{m4} G_{m9} G_{m10} + C_1 G_{m7} G_{m8} G_{m11} G_{m12}) + \\ C_4 (G_{m7} - G_{m9})(G_{m8} - G_{m10})(C_5 C_6 G_{m5} G_{m6} + C_1 C_2 G_{m13} G_{m14}) + \\ C_3 \{C_5 C_6 G_{m1} G_{m2} G_{m5} G_{m6} + C_4 C_6 G_{m5} G_{m6} G_{m11} G_{m12} + \\ C_2 [C_6 G_{m3} G_{m4} G_{m11} G_{m12} + G_{m13} G_{m14} (C_1 G_{m1} G_{m2} + C_4 G_{m3} G_{m4})]\}$$

$$b_2 = C_5 C_6 G_{m5} G_{m6} (G_{m2} G_{m7} G_{m8} + G_{m1} G_{m9} G_{m10}) + \\ C_1 C_2 G_{m13} G_{m14} (G_{m2} G_{m7} G_{m8} + G_{m1} G_{m9} G_{m10}) + \\ C_3 \{C_6 G_{m1} G_{m5} G_{m6} G_{m11} G_{m12} + \\ G_{m13} G_{m14} [C_2 G_{m2} G_{m3} G_{m4} + C_4 G_{m5} G_{m6} (G_{m1} + G_{m2})]\}$$

$$b_1 = C_6 G_{m5} G_{m6} G_{m7} G_{m8} G_{m11} G_{m12} + C_3 G_{m1} G_{m2} G_{m5} G_{m6} + \\ C_4 G_{m5} G_{m6} (G_{m7} - G_{m9})(G_{m8} - G_{m10}) + C_2 G_{m3} G_{m4} G_{m9} G_{m10}$$

$$b_0 = G_{m5} G_{m6} G_{m13} G_{m14} (G_{m2} G_{m7} G_{m8} + G_{m1} G_{m9} G_{m10})$$

$$c_3 = \frac{G_{m13} G_{m14}}{C_5 C_6}$$

$$c_2 = \frac{G_{m7} G_{m10}}{C_3 C_4}$$

$$c_1 = \frac{G_{m5} G_{m6}}{C_1 C_2}$$

According to the derived equations, the notch center frequency is determined by coefficients c1, c2, c3, wherein capacitance is set fixed. The notch center frequency can be adjusted effectively by partly adjusting transconductance (Gm5, Gm6, Gm7, Gm10, Gm13, Gm14) of the OTA. It is found that zero c1, c2, c3 of the sixth order notch filter is made up of three sets of second order notch filters.

Therefore, for correcting the notch center frequency of the sixth order notch filter as exemplified in the invention, it is to input a reference frequency to the system, and allow the digital correction mechanism described in the invention to firstly correct the notch center frequency of each second order filter unit, that is to adjust the OTA that replaces equivalent capacitance. When each second order notch filter unit has been corrected, the switch units of the invention are used to construct the sixth order ladder-tye OTA notch filter shown in FIG. 12 from the second order notch filter units.

The examples above are only illustrative to explain principles and effects of the invention, but not to limit the invention. It will be apparent to those skilled in the art that modifications and variations can be made without departing from the scope of the invention. Therefore, the protection range of the rights of the invention should be as defined by the appended claims.

What is claimed is:

1. A high order filter circuit including:
a plurality of second order filter units for filtering inputted signals;
a plurality of switch units for connecting the plurality of second order filter units in a cascade to form a high order filter unit when the switch units are closed, and for restoring the high order filter unit to the plurality of second order filter units when the switch units are opened;
an analog-to-digital converter (ADC) having a first working status and a second working status, for detecting peaks of predetermined band signals outputted from the second order filter units and digitalizing the peaks when the ADC is in the first working status, and for detecting and converting the predetermined band signals from the second order filter units to digital signals and outputting the digital signals when the ADC is in the second working status; and
a digital correction unit for comparing the digitalized peaks with a default value and generating comparison results, and according to the comparison results, the digital correction unit generating frequency control signals and working status control signals and sending them as feedbacks respectively to the second order filter units for adjusting their working frequencies and to the ADC for switching its working status.

2. The high order filter circuit according to claim 1, wherein the second order filter unit is a second order notch filter unit or a second order band-pass filter unit, and the working frequency is a notch center frequency of the notch filter unit or a band-pass center frequency of the band-pass filter unit.

3. The high order filter circuit according to claim 2, wherein the second order notch filter unit includes a preamplifier, a low-pass filter, a notch filter and a post-amplifier, which are connected in a cascade.

4. The high order filter circuit according to claim 2, wherein the second order band-pass filter unit includes a preamplifier, a low-pass filter, a band-pass filter and a post-amplifier, which are connected in a cascade.

5. The high order filter circuit according to claim 1, wherein the second order filter unit is made up of an operational transconductance amplifier (OTA).

6. The high order filter circuit according to claim 5, wherein the working frequency of the second order filter unit is adjusted by changing transconductance of the OTA.

7. The high order filter circuit according to claim 1, wherein the digital correction unit includes:
a register unit for storing the digitalized peaks;

a comparison unit for comparing the digitalized peaks with the default value and generating comparison results;
a control unit for generating the working status control signals and counting mode control signals according to the comparison results from the comparison unit; and
a counting unit for performing forward or backward counting according to the counting mode control signals from the control unit to generate the frequency control signals.

* * * * *